United States Patent [19]

Beckett

[11] Patent Number: 5,628,921

[45] Date of Patent: *May 13, 1997

[54] DEMETALLIZING PROCEDURE

[75] Inventor: D. Gregory Beckett, Oakville, Canada

[73] Assignee: Beckett Technologies Corp., Mississauga, Canada

[*] Notice: The term of this patent shall not extend beyond the expiration date of Pat. No. 5,340,436.

[21] Appl. No.: 470,016

[22] Filed: Jun. 6, 1995

Related U.S. Application Data

[63] Continuation of Ser. No. 226,077, Apr. 11, 1994, abandoned, which is a continuation-in-part of Ser. No. 655,022, Feb. 14, 1991, abandoned.

[51] Int. Cl.$^6$ ........................................................ B05D 5/00
[52] U.S. Cl. ........................................ 216/91; 216/102
[58] Field of Search ................................ 216/49, 91, 100, 216/102, 92; 134/15

[56] References Cited

U.S. PATENT DOCUMENTS

| | | | |
|---|---|---|---|
| 2,849,298 | 8/1958 | Werberig | 156/634 |
| 3,536,545 | 10/1970 | Traynor et al. | 156/639 |
| 3,898,095 | 8/1975 | Berdan et al. | 156/665 X |
| 4,087,300 | 5/1978 | Adler | 156/184 |
| 4,419,181 | 12/1983 | Tanaka et al. | 156/640 |
| 4,552,614 | 11/1985 | Beckett | 156/640 |
| 4,935,093 | 6/1990 | Reeb | 156/634 X |
| 5,092,958 | 3/1992 | Yarita et al. | 156/640 X |
| 5,340,436 | 8/1994 | Beckett | 156/639 |

*Primary Examiner*—Thi Dang
*Attorney, Agent, or Firm*—Jeffrey T. Imai; D. Doak Horne; Arne I. Fors

[57] ABSTRACT

Selective demetallization of an etchable metal layer supported on a polymeric material or other microwave transparent material, or a self-supporting etchable metal layer, particularly aluminum of thickness at least about 1 micron adhesively joined to a flexible polymeric material substrate, is described. A web of polymeric material bearing the etchable metal layer, or an unsupported etchable metal layer, has a pattern of etchant-resistant material first applied and then the web is immersed in and passed through a bath aqueous etchant, particularly hot aqueous sodium hydroxide solution, for a time at least sufficient completely remove the etchable metal from non-protected areas of the web. The demetallized web is washed and dried. Specific structure incorporating the selectively demetallized etchable metal layer also are described.

23 Claims, 2 Drawing Sheets

DEMETALLIZING PROCEDURE

BACKGROUND OF RELATED APPLICATION

This is a continuation of application Ser. No. 08/226,077 filed Apr. 11, 1994, now abandoned which is a continuation-in-part of U.S. patent application Ser. No. 655,022 filed Feb. 14, 1991 (now abandoned).

FIELD OF INVENTION

The present invention is directed towards the selective demetallization of etchable metal, particularly supported on a web of microwave transparent material.

BACKGROUND TO THE INVENTION

In U.S. Pat. No. 4,398,994, assigned to the assignee hereof and the disclosure of which is incorporated herein by reference, there is described a continuous method of forming decorative patterns of aluminized plastic film and the use of such patterned film in packaging.

As described therein, a web of aluminized polymer film is printed with a pattern of etchant-resistant material, corresponding to the pattern desired to be retained on the aluminized surface. Aqueous sodium hydroxide solution is applied to the patterned film to etch away the exposed aluminum while the aluminum covered by etchant-resistant material is untouched.

In U.S. Pat. No. 4,552,614, assigned to the assignee hereof and the disclosure of which is incorporated herein by reference, there is described an improved procedure to effect such selective demetallization by employing spray application of the aqueous etchant to the patterned aluminized surface.

More recently, in U.S. Pat. No. 4,869,778, it has been proposed to form a micropattern on the aluminized surface by first contacting the patterned aluminized polymeric film with a warm, essentially saturated caustic solution followed by contact with an acidic solution and washing.

The procedures described in the aforementioned prior art are very effective in achieving selective demetallization of relatively thin aluminum layers (generally less than about 1000 Å in thickness) supported on a polymeric web to completely remove aluminum from selected areas of the surface of the polymeric web for a variety of purposes, such as in decorative packaging and in microwave susceptor applications. The procedures, however, are less effective with relatively thick aluminum layers supported on a polymeric material web or unsupported because of rapid depletion of the etchant in contact with the web by the etched material.

SUMMARY OF INVENTION

In accordance with one aspect of the present invention, there is provided a method of effecting selective demetallization of an etchable metal layer, which may be supported on a microwave transparent material substrate, generally a polymeric film substrate, or unsupported, which comprises applying a pattern of etchant-resistant material to the etchable metal layer corresponding to a desired pattern of non-etched metal, repeatedly contacting the etchable metal with an aqueous etchant material for a time at least sufficient to effect complete removal of the etchable metal from areas of the etchable metal layer not covered and protected by the pattern of etchant-resistant material, and washing spent etchant solution from the resulting etched polymeric film substrate.

By providing prolonged exposure of the etchable metal layer to aqueous etchant by way of such repeated contact, relatively thick layers of etchable metals, such as aluminum, can be processed by the procedure of the present invention to effect selective demetallization.

The prolonged exposure and repeated contact preferably is carried out by immersing the patterned metallized polymeric film substrate or patterned unsupported metal layer in a bath of etchant and maintaining it immersed until complete removal of etchable metal from the non-protected areas is effected.

For reasons of economy, it is preferred to operate the process in a continuous manner, with the layer of etchable metal being processed continuously through the steps of pattern application, demetallization and washing.

The invention is particularly applicable to etchable metal of a thickness of at least about 1 micron, preferably aluminum, although the method is equally applicable to other etchable metals of differing thicknesses.

Where the etchable metal layer is of self-supporting thickness, the metal layer may be processed unsupported, provided that the etched pattern desired comprises a continuous metal layer with apertures, such as elongate slots, therethrough. In such an operation, the same pattern of etchant-resistant material is required to be applied in register to both faces of the etchable metal layer. Following selective demetallization, the etched metal layer may be adhered, such as by laminating adhesive, to a dielectric substrate layer, such as a polymeric film layer or a paperboard layer. Alternatively, etched metal layers may be adhered, such as by laminating adhesive, to both sides of a dielectric substrate. In a further alternative, the etched metal layer may be sandwiched between outer layers of dielectric material, with such outer layers of the resulting laminate being the same or different materials.

The selectively demetallized self-supporting metal layer resulting from such selective demetallization constitutes one aspect of the present invention. According to this aspect, there is provided a novel element, comprising a self-supporting layer of flexible etchable metal having a thickness of at least about 1 micron and having a plurality of apertures formed therethrough, and a layer of etchant-resistant material on each face of said layer of flexible etchable metal in a pattern completely overlying the metal layer and defining the periphery of the plurality of apertures.

The plurality of apertures in this novel element or in the polymeric film supported structures described below may be elongate and sized and arranged so as to generate thermal energy from incident microwave radiation when the element is employed in a food packaging structure and located adjacent a foodstuff to be cooked by microwave radiation, as described in my copending U.S. patent application Ser. No. 650,246 filed Feb. 4, 1991 ("Amaze-Met"), now U.S. Pat. No. 5,117,078, assigned to the assignee hereof and the disclosure of which is incorporated herein by reference.

More usually, the etchable metal is supported on a microwave transparent substrate, generally a polymeric film substrate, either by direct engagement, such as is achieved by vapor depositing the metal on the polymeric substrate, or by adhesive bonding of the metal to the polymeric film substrate. The latter structure is more usual with the thicknesses of metal with which the present invention is particularly concerned. However, the present invention may be employed with metallized polymeric films bearing metal in a thickness opaque to light.

In a preferred embodiment of the invention, there is provided a continuous method of effecting selective demetallization of a layer of aluminum having a thickness of at least about 1 micron supported on a web of flexible polymeric material, which comprises continuously applying a pattern of sodium hydroxide-resistant material to the aluminum corresponding to a desired pattern of non-etched aluminum, continuously passing the patterned web in an immersed condition through a bath of aqueous sodium hydroxide solution having a temperature of about 10° to about 98° C. and a strength of about 0.1 to about 10 normal for a time of at least 0.5 secs. per micron thickness of the aluminum layer to effect complete removal of aluminum from areas of the web not covered and protected by the pattern, continuously washing the web free from spent sodium hydroxide solution, and drying the washed web.

Following drying of the web, it is preferred to apply a detackifying material to the exposed laminating adhesive in the etched areas of the web to avoid overlying layers of web adhering to one another when the web is reeled up. This preferred operation results in a novel laminate structure, which constitutes a further aspect of the invention. The detackifying material may be provided by laminating the etched face of the patterned metal layer to a layer of dielectric material, such as a further polymeric film layer, a paperboard layer or a paper layer.

In accordance with this aspect of the present invention, there is provided a novel laminate structure comprising a flexible polymeric substrate layer, a layer of adhesive coextensive with the substrate, a layer of an etchable metal having a thickness of at least about 1 micron overlying the substrate layer and adhered to the adhesive layer in a pattern, a layer of etchant resistant material overlying the etchable metal layer in the same pattern, and a layer of detackifying material overlying the adhesive layer at least in regions thereof not overlied by the etchable metal layer.

The present invention provides, in another aspect, an apparatus for effecting the preferred method of the present invention as described above, comprising an elongate tank adapted to hold a bath of aqueous etchant material and having an upstream end and a downstream end, means enclosing the elongate tank to provide an enclosure open only at the upstream end and downstream end to permit the etchable metal layer to enter and leave the tank, and guide means located within the tank and arranged to guide the web through the elongate tank from the upstream end to the downstream end below the intended level of the bath of etchant material. In one embodiment of this aspect of the invention, the web is guided horizontally through the bath while, in another embodiment, the web is guided sinusoidally through the bath. The guide means further are adapted to engage the etchable metal layer in driving relation to drive the etchable metal layer through the tank.

DESCRIPTION OF PREFERRED EMBODIMENTS

Figure 1:
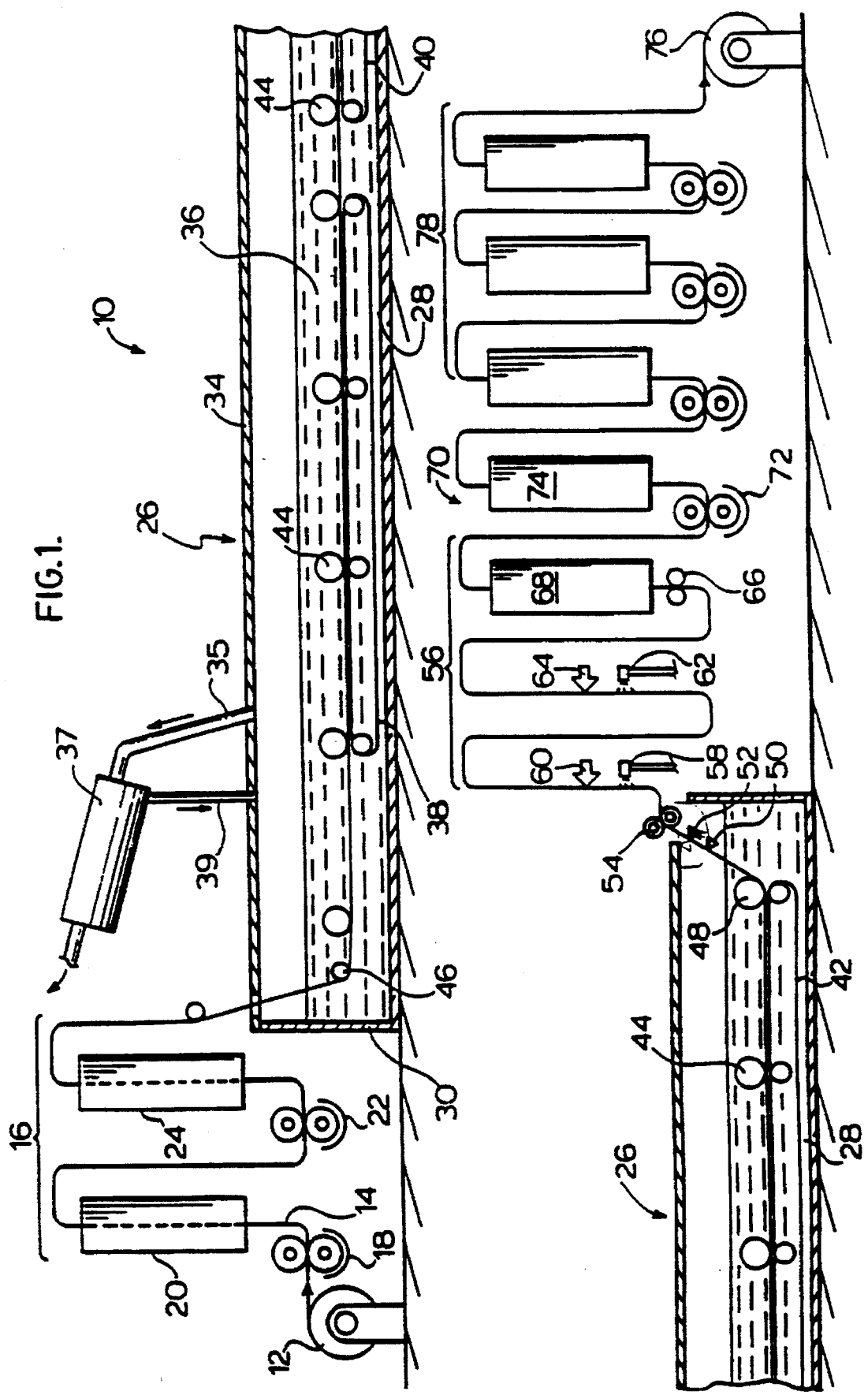
FIG. 1 is a schematic representation of one embodiment of apparatus which may be employed to effect the method of the invention.

Referring first to FIG. 1 of the drawings, a selective demetallizing machine 10 comprises a plurality of stations to effect selective demetallizing of flexible polymeric film bearing a metal layer thereon. A roll 12 of such film generally comprises aluminum of thickness of at least about 1 micron, usually up to about 15 microns, preferably about 3 to about 10 microns, typically aluminum foil of thickness about 7 to 8 microns, adhesively bonded to one face of the polymeric film.

A web 14 of the flexible polymeric film substrate supporting the aluminum layer is drawn from the roll 12 and passed to a protective lacquer applying station 16, wherein a pattern of etchant-resistant material is applied to the aluminum layer by a first applicator 18 before the pattern is dried by a first drier 20. The pattern of etchant-resistant material is applied to areas of the aluminum surface which it is desired to retain in the subsequent selective demetallization procedure. In view of the prolonged exposure of the web 14 to the etchant, it is usually desirable to apply the pattern of etchant-resistant material a second time to ensure a sufficient thickness of lacquer on the aluminum surface to resist the etchant. Accordingly, the web 14 passes, after the first drier 20, through a second etchant-resistant material applicator 22 and a second drier 24, before passing to an etching station 26.

The etching station 26 comprises an elongate horizontal tank 28 through which the patterned web 14 passes from an upstream end 30 to a downstream end 32. The tank 28 is provided with an upper closure 34 to prevent significant evaporative losses from the tank 28 into the ambient atmosphere. The interior of the tank 28 may be maintained under a slightly subatmospheric pressure to avoid loss of moisture through the end gaps between the upper closure 34 and the tank end walls through which the web is required to pass to enter and exit the tank 28. For this purpose, a conduit 35 to which a subatmospheric pressure is applied may communicate with the atmosphere above the liquid level in the tank, with an associated scrubber 37 to remove moisture for return to the tank 28 through line 39.

The tank 28 holds a bath 36 of aqueous etchant material, usually aqueous sodium hydroxide solution for aluminum as the etchable metal. Although the temperature of the aqueous sodium hydroxide solution may vary widely, from about 10° to about 98° C., the aqueous sodium hydroxide solution generally is maintained hot to enhance rapid etching of the exposed aluminum metal, usually in the range of about 50° to about 90° C., preferably about 70° to about 75° C. The strength of the sodium hydroxide solution may vary widely, usually from about 0.1 to about 10 normal, with the stronger solutions in the range of about 2 to about 3 normal, being preferred to enhance rapid etching of the exposed aluminum.

Three endless driven belts 38, 40 and 42 (only parts of belts 40 and 42 are shown) are provided immersed in the bath 36 of aqueous sodium hydroxide solution and formed of a suitable etchant-resistant material, for example, stainless steel mesh. The driven belts 38, 40 and 42 each has a series of roller elements 44 located in close proximity to the upper surface of the respective belt, so that the web 14 passing between the roller elements 44 and the adjacent upper belt surface is engaged by both, to ensure driven engagement of the web 14 by the respective belt. Although three endless belts 38, 40 and 42 are illustrated, any convenient number of such belts may be provided. Any other convenient drive mechanism may be employed to drive the web 14 through the tank 28.

The web 14 enters the tank 28 at its upstream end 30 and is immersed in the bath 36 by passing over a guide roller 46. The web 14 then passes in a generally horizontal path through the tank 28 immersed in the bath 36 to a guide roller 48 and out of the tank 28 at the downstream end 32. During passage through the tank 28, the web 14 is driven by the conveyer belts 38, 40 and 42.

In the prior art of U.S. Pat. No. 4,552,614 referred to above, the web is driven through the apparatus by a drive roller located at the downstream end of the demetallizing tank. However, the additional dwell time required for the generally thicker aluminum layers with which the present invention is concerned necessitates that the web be positively driven through the tank 28 rather than drawn, to avoid inordinate stretching and distortion of the web.

As the web 14 passes through the tank, the hot aqueous alkali etches the exposed aluminum and removes it from areas of the web not protected by the etchant-resistant material. Since the web 14 remains submerged during its passage through the tank 28, the web is continuously in contact with fresh hot sodium hydroxide solution, which enhances the etching of the exposed aluminum.

The speed of movement of the web 14 through the tank 28, the length of tank 28 and the temperature and strength of the aqueous sodium hydroxide solution are coordinated to provide a dwell time of the web 14 in contact with the hot aqueous sodium hydroxide solution of at least about 0.5 secs. per micron of thickness of metal layer, preferably in the range of about 5 to about 50 secs per micron of thickness of metal, so as to ensure that the metal is completely etched from the exposed areas of the web not protected by the pattern of etchant-resistant material.

The rate of movement of the web 14 through the tank may vary widely, but generally higher speed operations are preferred in the interests of economy, generally up to about 350 meters/min, preferably about 150 to about 250 meters/min, although lower speeds down to 10 meters/min may be employed.

As etching of the web 14 continues in the tank 28, etched aluminum becomes dissolved in the aqueous sodium hydroxide solution and tends to build up in the solution. The bath may be intermittently, or more preferably, continuously rejuvenated by appropriate processing of the solution to remove the dissolved aluminum and regenerate the alkali. The process may be operated with a dissolved aluminum concentration in the bath 36 which may vary widely, generally from about 5 to about 95% of aluminum saturation of the bath, preferably towards the lower end of this range, from about 15 to about 30%.

The dissolved aluminum may be removed from the aqueous etchant solution and the alkali regenerated in any convenient manner to maintain a closed-loop for the alkali, with make-up quantities of sodium hydroxide being required only on a periodic basis. One particular procedure which can be adopted involves removal of dissolved aluminum by crystallization of aluminum trihydrate, described in more detail below with respect to the embodiment of FIG. 2. During reaction in the tank 28, the caustic soda combines with etched aluminum and forms sodium aluminate, which then is converted to aluminum hydroxide and sodium hydroxide by hydrolysis in a regeneration operation outside the tank 28. This procedure is described in an article by Dejat entitled "Aluminum Anodizer Regenerates Caustic Etch Solution" published in Plating and Surface Finishing, April 1984, the disclosure of which is incorporated herein by reference.

After the etched web leaves the bath 36 at the downstream end of the tank 28 but before the web leaves the tank 28, the web 14 engages a first doctor blade 50 and then a second doctor blade 52 to wipe off liquid etchant from the surfaces of the web, and retain such liquid in the tank 28, before passing between rollers 54.

The demetallized web then passes to a washing and drying station 56. The demetallized web has wash water sprayed on by first wash water sprayers 58 followed by wiping of the washed surface by a first wiper blade 60, and then has wash water sprayed on again by second wash water sprayers 62 followed by wiping of the washed surface by a second wiper blade 64. The washed demetallized web is passed between a pair of rolls 66, which comprise a rubber pinch roll to squeeze the web into engagement with a metal surfaced drive roll to ensure a positive pulling drive is effected on the web 14 through the washing operation. The pair of rollers 66 also serve to remove surface water from the web.

Spent wash water from the washing operations may be recycled to the tank 28 to make up for evaporative losses, as required. Following washing of the etched web in this way, the washed, clean patterned web is dried by passing through a drier 68, which removes residual surface moisture from the web. The washing and drying operations effected in the washing and drying station 56 also may be effected in the manner described below with respect to such operations in the embodiment of FIG. 2.

Where the web 14 comprises an aluminum layer adhesively bonded to the polymeric film layer, the selective demetallization exposes the adhesive in the regions of the web which are demetallized. This adhesive tends to be somewhat tacky and hence the dried demetallized web next is passed to a detackifying station 70, where the web first is contacted with a detackifier of suitable composition by an applicator 72 and then is dried by passing through a drier 74. In place of or in addition to applying a liquid detackifying material to the web, a further web of dielectric material, such as a polymeric film web, may be laminated to the etched face of the web.

Optionally, prior to winding up the web into a reel 76, the web may be passed through an in-line print station 78, where one or more colors, for example, three as illustrated, may be applied to the web in a desired pattern, such as a decorative pattern.

The reel 76 of processed web is formed on a wind-up roll which is drivingly rotated to draw the web through the drying, detackifying and optional coloring operations. Other drive procedures may be adapted.

Figure 2:
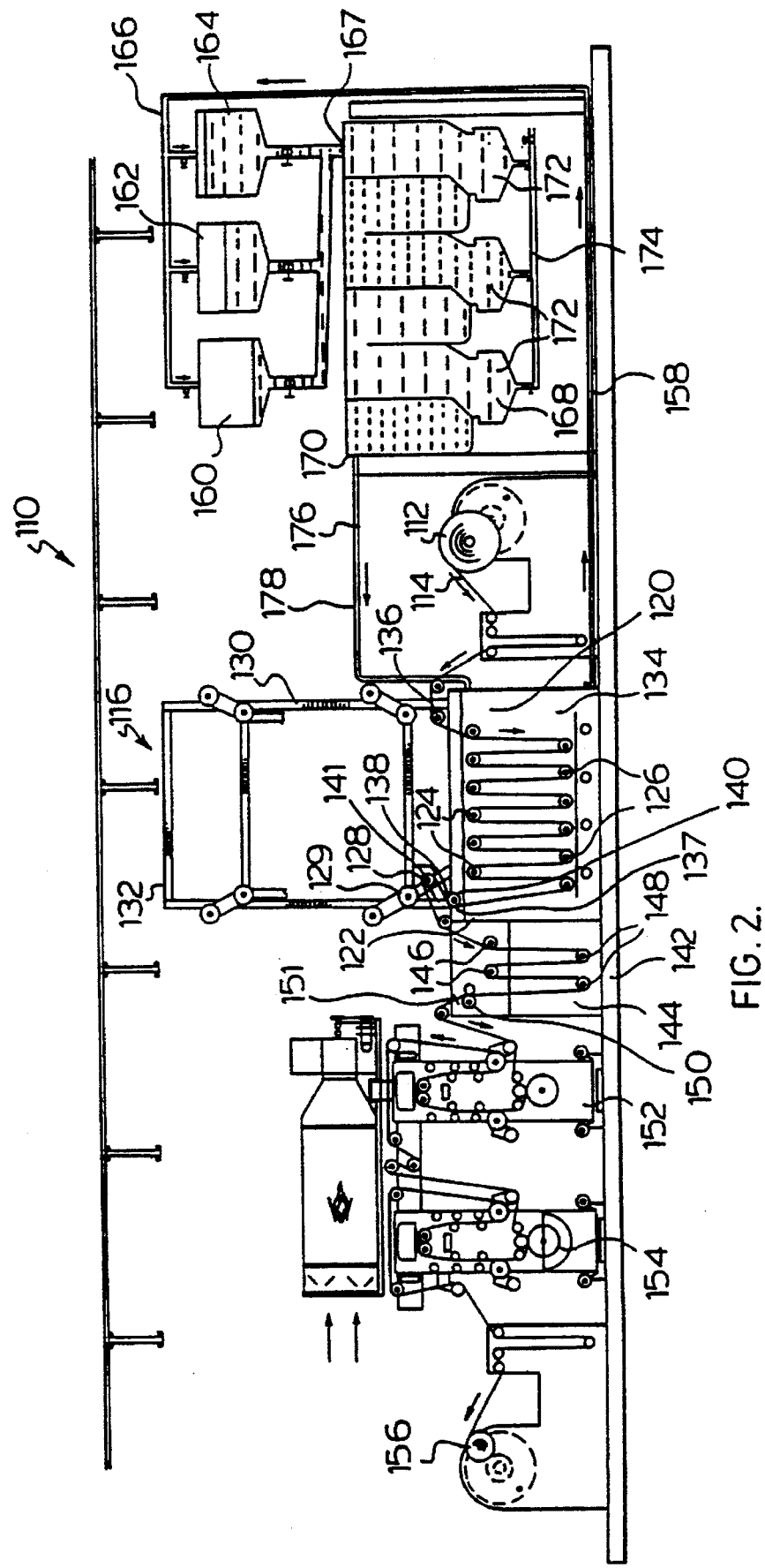
FIG. 2 is a schematic representation of another embodiment of apparatus which may be employed to effect the method of the invention.

Turning now to FIG. 2, there is illustrated schematically therein a further embodiment of selective demetallizing machine 110, which operates similarly to the demetallizing machine 10 described above, and represents the current best mode of putting the invention into effect known to the applicant. A roll 112 of flexible polymeric film bearing a metal layer thereon, generally comprises aluminum of thickness of at least about 1 micron, usually up to about 15 microns, preferably about 3 to about 10 microns, typically aluminum foil of thickness about 7 to 8 microns, adhesively bonded to one face of the polymeric film.

A web 114 of the flexible polymeric film substrate supporting the aluminum layer, which is drawn from the roll 112, has a pattern of etchant-resistant material pre-applied to the aluminum layer in areas of the aluminum surface which it is desired to retain such metal in the subsequent demetallization operation.

The web 114 passes to an etching station 116 which comprises a tank 118 through which the patterned web 114 passes from an upstream end 120 to a downstream end 122. The tank 118 is provided with an upper closure (not shown) to prevent significant evaporative losses from the tank 118 into the ambient atmosphere. The interior of the tank 118 may be maintained under a slight subatmospheric pressure to avoid loss of moisture through the end gaps between the upper closure and the tank end walls through which the web is required to pass to enter and exit the tank 118. As illustrated in FIG. 1, a conduit, or series of conduits, may be employed to apply the subatmospheric pressure to the interior of the tank, with an associated scrubber to remove moisture for return to the tank 118.

In contrast to the structure shown in FIG. 1, the tank 118 is relatively deep and the web 114 is guided through the tank in a sinusoidal path by sets of upper rollers 124 and lower rollers 126. This arrangement permits efficient demetallizing to be effected in the tank 118, while significantly simplifying the structure and significantly decreasing the physical length of the tank 118.

The upper and lower sets of rollers 124, 126 are mounted to a carriage structure 128, which itself is mounted by rollers 129 to vertical rails 130 of a frame structure 132, which permits the carriage 128 to be raised from the tank 118 and lowered into the tank 118. This arrangement is particularly beneficial in permitting threading or rethreading of the web without having to empty the tank 118 of aqueous etchant material.

The tank 118 holds a bath 134 of aqueous etchant material, usually aqueous sodium hydroxide solution for aluminum as the etchable metal. The aqueous sodium hydroxide solution generally is maintained hot to enhance rapid etching of the exposed aluminum metal, usually in the range of about 50° to about 90° C., preferably about 70° to about 75° C. The strength of the sodium hydroxide solution may vary widely, usually from about 0.1 to about 10 normal, with the stronger solutions in the range of about 2 to about 3 normal, being preferred to enhance rapid etching of the exposed aluminum.

The web 114 enters the tank at the upstream end 120 with the assistance of a guide roller 136 and passes alternatively about one of the lower and upper sets of rollers 124, 126 immersed in the bath 134 of aqueous etchant material. As the web 114 passes through the tank 118, the hot aqueous alkali etches the exposed aluminum and removes it from areas of the web 114 not protected by the etchant-resistant material. Since the web 114 remains submerged during its passage through the tank 118, the web is continuously in contact with fresh hot sodium hydroxide solution, which enhances etching of the exposed aluminum.

The speed of movement of the web 114 through the tank 118, the length of tank 118 and the temperature and strength of the aqueous sodium hydroxide solution are coordinated to provide a dwell time of the web 114 in contact with the hot aqueous sodium hydroxide solution of at least about 0.5 secs. per micron of thickness of metal layer, preferably in the range of about 5 to about 50 secs per micron of thickness of metal layer, so as to ensure that the metal is completely etched from the exposed areas of the web not protected by the pattern of etchant-resistant material.

The rate of movement of the web 114 through the tank may vary widely, but generally higher speed operations are preferred in the interests of economy, generally up to about 350 meters/min, preferably about 150 to about 250 meters/min, although lower speeds down to 10 meters/min may be used. The web 114 is driven through the tank 134 by providing driven power to at least some of the lower and upper sets of rollers 124, 126.

As etching of the web 114 continues in the tank 118 etched aluminum becomes dissolved in the aqueous sodium hydroxide solution and tends to build up in the solution. The bath may be intermittently, or more preferably, continuously rejuvenated by appropriate processing of the solution to remove the dissolved aluminum and regenerate the alkali, as described in more detail below. The process may be operated with a dissolved aluminum concentration in the bath 134 which may vary widely, generally from about 5 to about 95% of aluminum saturation of the bath, preferably towards the lower end of this range, from about 15 to about 30%.

As the etched web leaves the bath 134 at the downstream end 122 of the tank 118, the web 114 is engaged by a first doctor blade 137 as it wraps around a guide roller 138, in order to wipe liquid etchant from one surface of the web 114. The guide roller 138 has a doctor blade 140 associated with its surface to remove liquid etchant transferred thereto by engagement with the guide roller 138. The etched web 114 then is engaged by a second doctor blade 141 as it wraps around roller 128 in order to wipe liquid etchant from the opposite side of the web 114.

The demetallized web 114 then passes in a sinusoidal path through a wash tank 142 having a bath 144 of wash water therein, which serves to wash both faces of the web free from residual etchant material. The web 114 is guided in its passage through the wash tank 142 by sets of upper rollers 146 and lower rollers 148, at least some of which may be driven. The web 114 passes through the nip between a pair of rollers 150 before exiting the wash tank 142, which serves to remove moisture from the surface of the web. The web 114 next passes between a pair of doctor blades 151 which serve to remove further moisture from the washed web surfaces.

The washed demetallized web 114 next passes to a drying station 152 to remove residual moisture from the web. The web is subjected to jets of hot air against the same from nozzles 153 to dry the same as it is trained through the drying station.

Where the web 114 comprises an aluminum layer adhesively bonded to the polymeric film layer, the selective demetallization exposes the adhesive in the regions of the web which are demetallized. This adhesive tends to be somewhat tacky and the dry web 114 is passed in contact with a bath 154 of detackifying material of suitable composition. The detackifying material then is dried by jets of hot air from nozzles 155.

A web of dielectric material, such as polymeric film or paperboard, may be adhered to the web to overlie the exposed adhesive by a suitable laminating operation which is employed as an alternative to or in combination with the application of a liquid detackifying material.

A roll 156 of processed web is formed on a wind up reel which is drivingly rotated to draw the web 114 through the drying and detackifying operations. Additional drives may be provided to the drying station and the detackifying station, if required. Optionally, prior to winding the web 114 onto the roll 156, the web 114 may be passed through an in-line print station, where one or more colors may be applied to the web 114 in a desired pattern, such as a decorative pattern.

To regenerate the etchant solution in bath 134, etchant is continuously removed from tank 120 by line 158 and passed to a series of parallel-fed tanks 160, 162 and 164. The hot sodium hydroxide in pipe 158 is cooled during its passage to the tanks, such as by a cooling jacket 166, to induce formation of crystallize aluminum trihydrate (aluminum hydroxide), which serves to remove aluminum from the sodium hydroxide solution. The tanks 160, 162 and 164 are filled successively, with one tank being filled before a next one. In the tanks, the liquid is stirred gently to promote the growth of crystals of aluminum trihydrate in the liquid therein.

When the liquid has been held for the desired period of time, generally long enough for a second tank to fill up, the liquid is discharged from the first tank filled to the inlet 167 of a precipitating tank 168 through which the liquor passes in a sinusoidal path below and over baffles 169 to an outlet 170. This sinusoidal passage of liquid encourages settlement of the aluminum trihydrate crystals in the precipitation tank 168, so that a successively lesser concentration of crystals is present in the sodium hydroxide solution as it passes through the precipitation tank 168.

The aluminum trihydrate crystals settle from the aqueous phase into sumps 172 in the precipitation tank 168 and form a sludge-like mass in the sumps 172. From time to time, as required, the sludge may be discharged from the sumps 172 by line 174 to filtration separation.

The sodium hydroxide solution exiting the precipitation tank 168 by outlet 170 is passed by pipe 176 to the etch tank 134. The sodium hydroxide solution is heated during its return from the precipitation tank 168 to the etching tank 120, such as by heating jacket 178, to redissolve aluminum trihydrate crystals in the sodium hydroxide solution for the etching process. Make-up quantities of sodium hydroxide may be added from time to time, as required.

The demetallizing machines 10 and 110 may be used to effect selective demetallization of aluminum and other etchable metals generally in relatively thick layers supported by the polymeric web over a wide range of speeds of operation, as mentioned above.

The embodiments of FIGS. 1 and 2 have described the selected demetallization of an aluminum layer supported in adhered relationship to the polymeric material web. The procedures also may be employed with metallized (by vapor deposition or otherwise) polymeric material web bearing a metal layer of opaque thickness, except that in this case, no detackifier application step is required. In addition, the procedures may be employed with an unsupported metal layer, which is of a thickness which permits it to be processed by the equipment, in which case the pattern of etchant-resistant material is applied, in register, to both faces of the metal layer.

The demetallizing machines 10 and 110 may be used to effect selective demetallization of an etchable metal layer for a variety of purposes. For example, the demetallizing operation may be effected to produce materials useful in microwave packaging applications, such as described in my aforementioned copending U.S. patent application Ser. No. 650,246.

As described therein, the provision of a plurality of elongate slots formed through a flexible electroconductive metal layer normally opaque to microwave radiation enable thermal energy to be generated from such microwave radiation when said metal layer is incorporated into packaging material and located adjacent a foodstuff to be cooked by microwave radiation. The demetallizing machines 10 and 110 also may be employed to form other selectively demetallized elements comprising a pattern of electroconductive material adhered to a polymeric material layer, such as circuit boards and elements useful as carpet heaters or other heating applications.

The demetallizing operation carried out in the tank 28 or 118 employs continuous immersion of the patterned web to effect complete removal of aluminum or other etchable metal from the unprotected portions of the web surface. Any other equivalent procedure may be adopted, however, to ensure that there is repeated contact of etchant with the web for at least 0.5 secs. per micron of metal layer thickness on the web. For example, there may be employed a series of longitudinally-spaced spray applicators each successively applying etchant solution to the web to effect partial etching until the web has been completely demetallized in the desired locations of the web.

SUMMARY OF DISCLOSURE

In summary of this disclosure, the present invention provides a novel selective demetallization procedure particularly suited for relatively thick films of etchable metals by employing a relatively long contact time between the etchant and metal. Modifications are possible within the scope of this invention.

What I claim is:

1. A continuous method of effecting selective demetallization of a layer of aluminum having a thickness of about 1 to about 15 microns supported on a microwave transparent web of flexible polymeric material, which comprises:

providing said microwave transparent web as a continuous web and conveying said continuous web from a reel thereof successively through an etchant solution-applying zone, a washing zone and a drying zone, providing said microwave transparent web with a pattern of etchant-resistant material on said aluminum layer corresponding to a desired pattern of non-etched aluminum prior to said continuous web entering said etchant solution-applying zone, continuously driving said microwave transparent web with said pattern of etchant-resistant material thereon in an immersed condition through a bath of aqueous etchant material which is aqueous sodium hydroxide having a temperature of about 10° to about 90° C. and a strength of about 0.1 to about 10 normal and conveying said microwave transparent web through said etchant solution-applying zone for a period of time of at least about 0.5 seconds per micron thickness of said aluminum layer and at least sufficient to effect complete removal of said aluminum layer not covered and protected by said pattern of etchant-resistant material, wiping said aqueous etchant solution from the surfaces of said web before said web leaves said etchant solution-applying zone, contacting said web with wash water in said washing zone to remove residual etchant solution therefrom, wiping wash water from the surfaces of said web before said web leaves said washing zone, and drying said web in said drying zone.

2. The method of claim 1, wherein said etchable metal layer is adhesively mounted on said microwave transparent web of polymeric material.

3. The method of claim 1, wherein said aluminum layer is formed by metallizing said microwave transparent web of polymeric material to a thickness opaque to light.

4. The method of claim 1, including laminating a web of polymeric material or paperboard material to the face of said web bearing said aluminum layer and winding the resulting laminate into a reel thereof.

5. The method of claim 4 wherein, prior to said winding step, the laminate is passed through an in-line printing zone where one or more colors is applied to one or both faces of the laminate in a desired pattern.

6. The method of claim 1 wherein said web passes through said etchant-solution applying zone and through said washing zone in a sinusoidal path.

7. The method of claim 1 wherein said layer of aluminum is adhesively bonded to said web of flexible polymeric material to be supported thereby.

8. The method of claim 1 wherein said etchable metal has a thickness of about 3 to about 10 microns.

9. The method of claim 7 wherein said contact time is about 5 to about 50 seconds.

10. The method of claim 1 wherein said bath is housed within a substantially enclosed elongate tank.

11. The method of claim 10 wherein said bath has a temperature of about 50° to about 90° C.

12. The method of claim 10 wherein said bath has a temperature of about 70° to about 75° C.

13. The method of claim 12 wherein said aqueous sodium hydroxide solution has a strength of from about 2 to about 3 normal.

14. The method of claim 1 wherein said web is transported through the method steps at a rate of up to about 350 m/min.

15. The method of claim 10 wherein said web is transported through the elongate tank at a rate of about 10 to about 250 m/min.

16. The method of claim 10 wherein detackifying material is applied to said web subsequent to said drying step to effect detackification of adhesive exposed by said selective demetallization.

17. The method of claim 16 wherein said detackifying material comprises a layer of dielectric material applied to the etched face of said web following said drying step.

18. The method of claim 10 wherein said dissolved aluminum concentration of said bath is maintained at about 5 to about 95% of saturation of the bath by dissolved aluminum.

19. The method of claim 18 wherein the dissolved aluminum concentration of said bath is maintained within the range of about 15 to about 30% of saturation.

20. The method of claim 18 wherein said bath is treated to remove dissolved aluminum and to regenerate sodium hydroxide.

21. The method of claim 20 wherein said dissolved aluminum is in the form of sodium aluminate and said dissolved aluminum is removed and sodium hydroxide regenerated by converting said sodium aluminate to aluminum trihydrate and sodium hydroxide.

22. A method of effecting selective demetallization of a self-supporting aluminum web having a thickness of about 1 to about 15 microns and first and second sides to form an element having a plurality of apertures through said aluminum, which comprises:

applying a pattern of etchant-resistant material to both said first and second sides of said aluminum web in register and corresponding to a desired pattern of non-etched aluminum in the element and comprising a continuous aluminum web having a plurality of apertures therethrough, repeatedly contacting said aluminum web with an aqueous etchant material comprising an aqueous solution of sodium hydroxide by immersing said aluminum web in and passing said aluminum web through a bath of said aqueous etchant material having a temperature of about 10° to about 98° C. and a strength of sodium hydroxide of about 0.1 to about 10 normal for a period of time of at least about 0.5 seconds per micron thickness of said aluminum web and at least sufficient to effect complete removal of said aluminum from areas of said aluminum web not covered and protected by said pattern of etchant-resistant material and to form apertures through said aluminum web, removing said aluminum web from said bath, washing spent etchant solution from the removed aluminum web, and drying the washed aluminum web to provide said element comprising a self-supporting aluminum having a plurality of apertures therethrough.

23. The method of claim 1 wherein said aluminum web is passed in a sinusoidal path through and immersed in said bath of aqueous etchant material.

* * * * *